(12) United States Patent
Berry et al.

(10) Patent No.: US 6,839,237 B2
(45) Date of Patent: Jan. 4, 2005

(54) ELECTRONICS RACK ASSEMBLIES AND ASSOCIATED COMPONENTS

(75) Inventors: William E. Berry, Tacoma, WA (US);
Robert J. Fite, Olympia, WA (US);
Tomm V. Aldridge, Olympia, WA (US);
Barrett M. Faneuf, Lakewood, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/375,635

(22) Filed: Feb. 26, 2003

(65) Prior Publication Data

US 2003/0161114 A1 Aug. 28, 2003

Related U.S. Application Data

(62) Division of application No. 09/896,857, filed on Jun. 29, 2001, now Pat. No. 6,560,114.

(51) Int. Cl.$^7$ .............................. H05K 7/00; G06F 1/16
(52) U.S. Cl. ..................... 361/727; 361/732; 361/740; 312/332.1; 312/223.2; 439/157
(58) Field of Search ................................ 361/683–686, 361/724–729, 732, 740, 747; 312/223.1, 223.6, 332.1; 439/157; 248/68.1

(56) References Cited

U.S. PATENT DOCUMENTS

| | | | |
|---|---|---|---|
| 2,789,024 A | 4/1957 | Heisler | 312/333 |
| 3,088,054 A | 4/1963 | Meyer | 317/120 |
| 5,216,579 A | 6/1993 | Basara et al. | 361/383 |
| 5,431,491 A | 7/1995 | Melgaard et al. | 312/232.1 |
| 5,954,301 A * | 9/1999 | Joseph et al. | 248/68.1 |
| 5,980,281 A | 11/1999 | Neal et al. | 439/157 |
| 6,201,690 B1 | 3/2001 | Moore et al. | 361/683 |
| 6,220,879 B1 | 4/2001 | Ulrich | 439/160 |
| 6,266,237 B1 | 7/2001 | Jensen et al. | 361/683 |
| 6,373,695 B1 | 4/2002 | Cheng | 361/685 |
| 6,392,884 B1 | 5/2002 | Chou | 361/687 |
| 6,406,327 B1 * | 6/2002 | Soon | 439/501 |
| 6,560,114 B2 * | 5/2003 | Berry et al. | 361/727 |
| 2003/0064611 A1 * | 4/2003 | Musolf et al. | 439/43 |
| 2003/0202765 A1 * | 10/2003 | Franklin et al. | 385/135 |

FOREIGN PATENT DOCUMENTS

GB          732501          6/1955          ............ 40/5

* cited by examiner

*Primary Examiner*—Hung Van Duong
(74) *Attorney, Agent, or Firm*—Schwegman, Lundberg, Woessner & Kluth, P.A.

(57) ABSTRACT

An improved rack-mounted server comprises, in one embodiment, a slidable electronics tray having a top cover secured to the rack, to facilitate access to the tray when it is withdrawn from the rack. The tray also includes a camming mechanism to facilitate insertion of the tray into and its extraction from cable connectors or plugs affixed to the rack. The tray includes, in one embodiment, a movement detection mechanism to power it up or down when tray insertion or removal, respectively, is initiated. In addition, the rack includes an improved cable management system that can accommodate different cables and cable plugs. As a tray is inserted into or removed from the rack, corresponding connectors on the tray are electrically coupled to or uncoupled from cable plugs affixed to the rack, eliminating any need to remove cables from the tray or reinstall them.

16 Claims, 19 Drawing Sheets

ELECTRONICS RACK ASSEMBLIES AND ASSOCIATED COMPONENTS

This application is a divisional of U.S. patent application Ser. No. 09/896,857, filed Jun. 29, 2001, now issued as U.S. Pat. No. 6,560,114, which is incorporated herein by reference in its entirety.

TECHNICAL FIELD

Embodiments of the present invention relate generally to electronics packaging. More particularly, embodiments of present invention relate to an improved rack-mounted server that facilitates access to and/or replacement of electronics trays, and to methods of use thereof.

BACKGROUND INFORMATION

Computer networks, such as the Internet, utilize high performance computer systems called "servers". Servers typically have high performance processors and contain hardware and software capable of handling large amounts of data. Servers provide a large number of computer users with access to large stores of information. For example, servers are used to host web sites that can be accessed by many computers via the Internet.

One or more server components are often housed within a server housing or "server rack". Server racks are typically box-like structures or cabinets that contain a number of removable electronic modules or electronic trays ("e-trays"). Each e-tray can be a different server, or each e-tray can hold one or more components of a server. Server components can include modules, for example, for processors, disk drives (such as floppy disk drives, hard drives, compact disk or CD drives, and digital video disk or DVD drives), random access memory (RAM), network interfaces and controllers, SCSI (small computer systems interface) bus controllers, video controllers, parallel and serial ports, power supplies, and so forth.

FIG. 1 is a perspective view of a portion of a prior art server rack 1 and electronics tray 2. E-tray 2 can be a box-like housing having metal side panels 3, a top panel or cover 4, a bottom panel or base (not shown), and a front panel 5. These panels help to reduce the effect of potentially harmful electromagnetic interference (EMI), and to minimize the impact of various environmental factors such as dust. When a prior art e-tray 2 is removed from a server rack 1 for servicing, it is necessary to remove the cover 4 prior to servicing and to replace the cover 4 after servicing. This is a time-consuming operation with respect to relatively expensive equipment that is normally expected to operate with a minimum of down-time.

The various server components are electrically and functionally interconnected via wires or cables. Generally, in the prior art there are many cables coming out of at least one side, and sometimes several sides, of the server rack. Cables typically have an end connector or "cable plug" that fastens to a corresponding electrical "receptacle" on the e-tray. The cable plug and receptacle can be male, female, or another type of connector. Each e-tray can have multiple receptacles that require connection to corresponding multiple cable plugs.

"Cable management" is the implementation of a system whose object is to control the arrangement of the plethora of power and signal cables that run into and out of an electronic housing, such as a server rack. Many known server racks include dozens of cables in unsightly, disorganized, and potentially dangerous states of disarray.

As mentioned earlier, servers and their components, which are contained in e-trays, are expected to be highly reliable. When a server component requires servicing, the amount of time and effort expended in removing the e-tray should be kept to a minimum, and the same is true when the e-tray is ready to be reinserted into the server rack.

When a prior art e-tray is removed from a server rack, the service person may neglect to first power-own the e-tray. This can result in harmful arcing across the terminals of power supply connectors, to the extent that the terminals are often fused and will need to be replaced, thus incurring even more time and effort before the e-tray can be reinserted into the server rack. In addition, the service person can be exposed to potentially hazardous conditions.

For the reasons stated above, and for other reasons stated below which will become apparent to those skilled in the art upon reading and understanding the present specification, there is a significant need in the art for improved rack-mounted servers and methods of making such equipment.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, compositional, structural, electrical, and procedural changes may be made without departing from the spirit and scope of the present disclosure. The following detailed description is, therefore, not to be taken in a limiting sense, and the scope of embodiments of the present invention is defined only by the appended claims.

Embodiments of the present invention provide a solution to the need for quick access to electronic modules, such as e-trays, to enable such modules to be inspected, repaired, replaced, or upgraded quickly. Various embodiments are illustrated and described herein.

Figure 2:
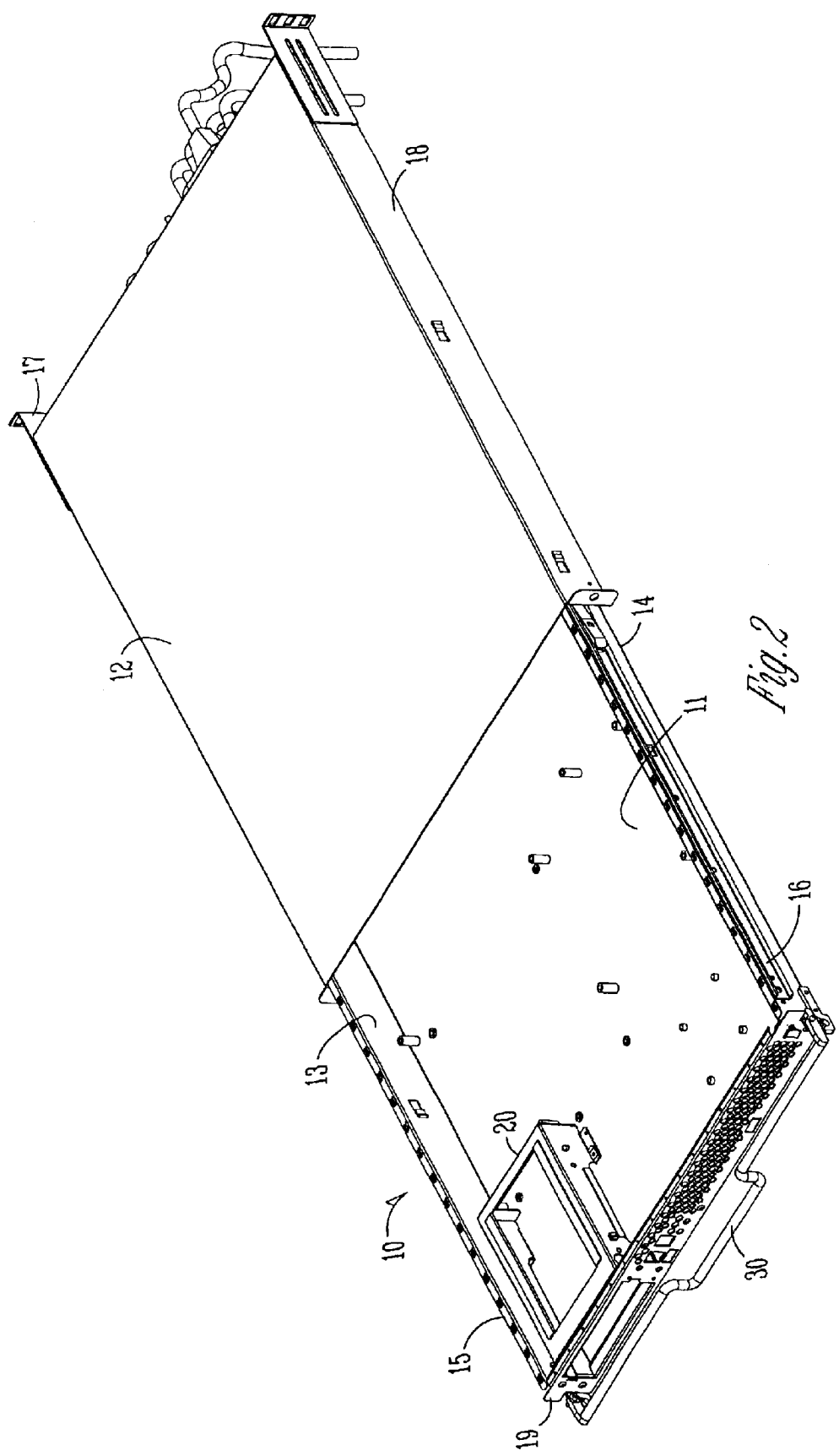
FIG. 2 is a front perspective view of a portion of an electronics tray and top cover, in accordance with one embodiment of the invention.

FIG. 2 is a front perspective view of a portion of an electronics tray 10 and top cover 12, in accordance with one embodiment of the invention. Top cover 12 comprises a metal panel and a pair of sidewalls 17 and 18 coupled at substantially right angles to the plane of the metal panel.

E-tray 10 comprises a base or bottom panel 11 on which one or more electronic components can be mounted, such as a disk drive (not shown) whose housing 20 is located on base 11. Typically, several electronic components are located on base 11. These components can be any of the components mentioned earlier.

E-tray 10 also comprises a front panel 19, a pair of opposing sides or side panels 13 and 14, and a back panel (not shown in FIG. 2). Each side 13 and 14 has a suitable mounting element to couple it to the inside of the corresponding sidewall 17 or 18, respectively, of top cover 12. In one embodiment, the mounting elements comprise mating rail assemblies or drawer glides. An inner drawer glide 15 and 16 is mounted on each side 13 and 14, respectively. A mating outer drawer glide (not shown in FIG. 2) is mounted on the inside surface of each sidewall 17 or 18 of top cover 12. In other embodiments, other types of mounting elements could be used, such as tongue-and-groove arrangements, rod-and-eyelet arrangements, box-within-a-box arrangements, or the like.

The mounting elements permit the e-tray 10 to be inserted substantially within the top cover 12 of the server rack or to be withdrawn from the top cover 12 of the server rack. Top cover 12 substantially covers e-tray 10 when it is inserted within the server rack, and top cover 12 remains affixed to the server rack when the e-tray 10 is withdrawn from the server rack.

Also seen in FIG. 2 is e-tray handle 30 used to insert e-tray 10 into its rack and to extract it from its rack. E-tray handle 30 will be discussed in greater detail below.

Figure 3:
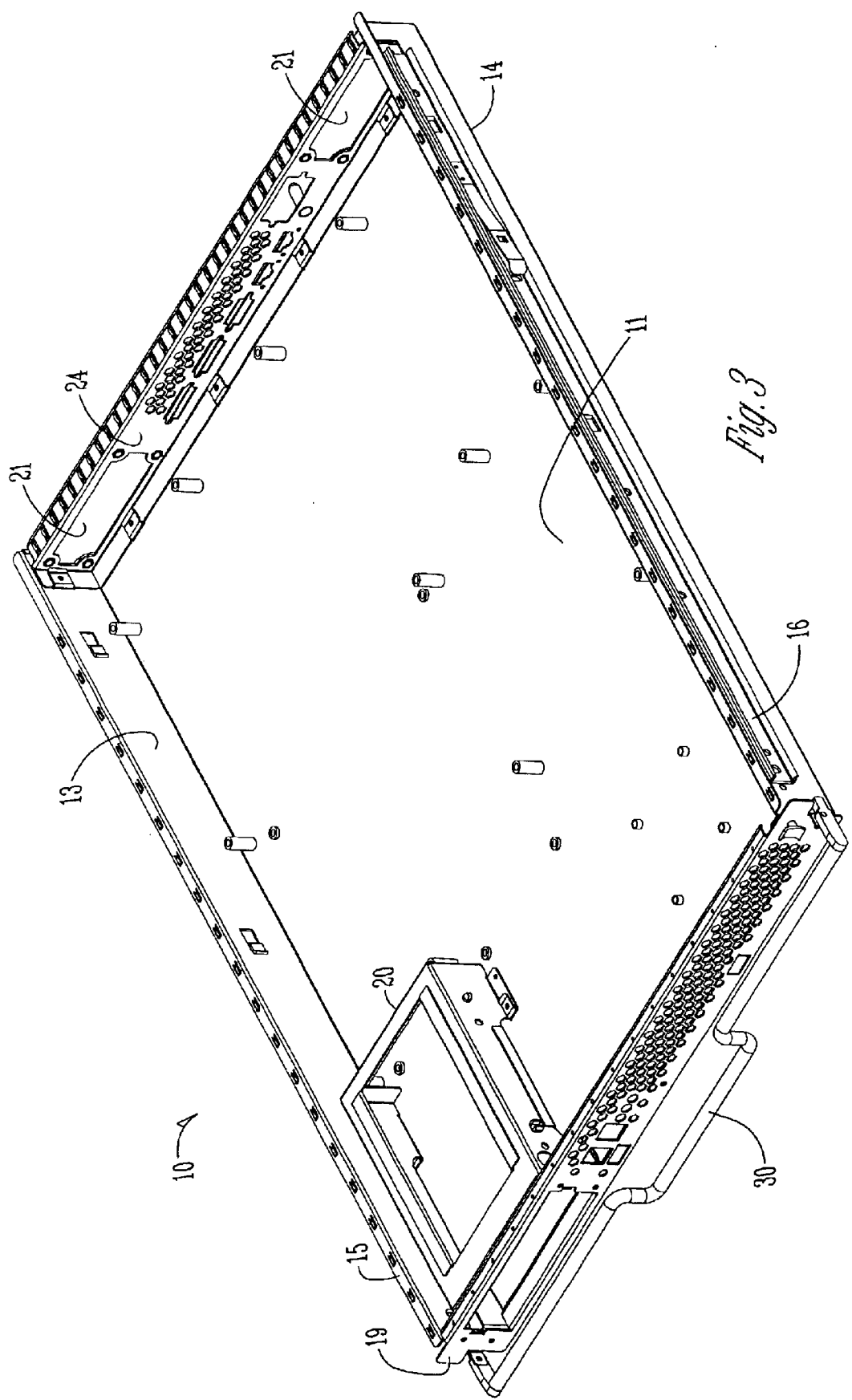
FIG. 3 is a front perspective view of an electronics tray, in accordance with one embodiment of the invention.

FIG. 3 is a front perspective view of an electronics tray 10, in accordance with one embodiment of the invention. This view of e-tray 10 is an enlarged view of e-tray 10 shown in FIG. 2. Rear panel 24 of e-tray 10, having airflow openings 21, can be seen in this figure. Otherwise, all elements are substantially as previously shown in FIG. 2.

Figure 4:
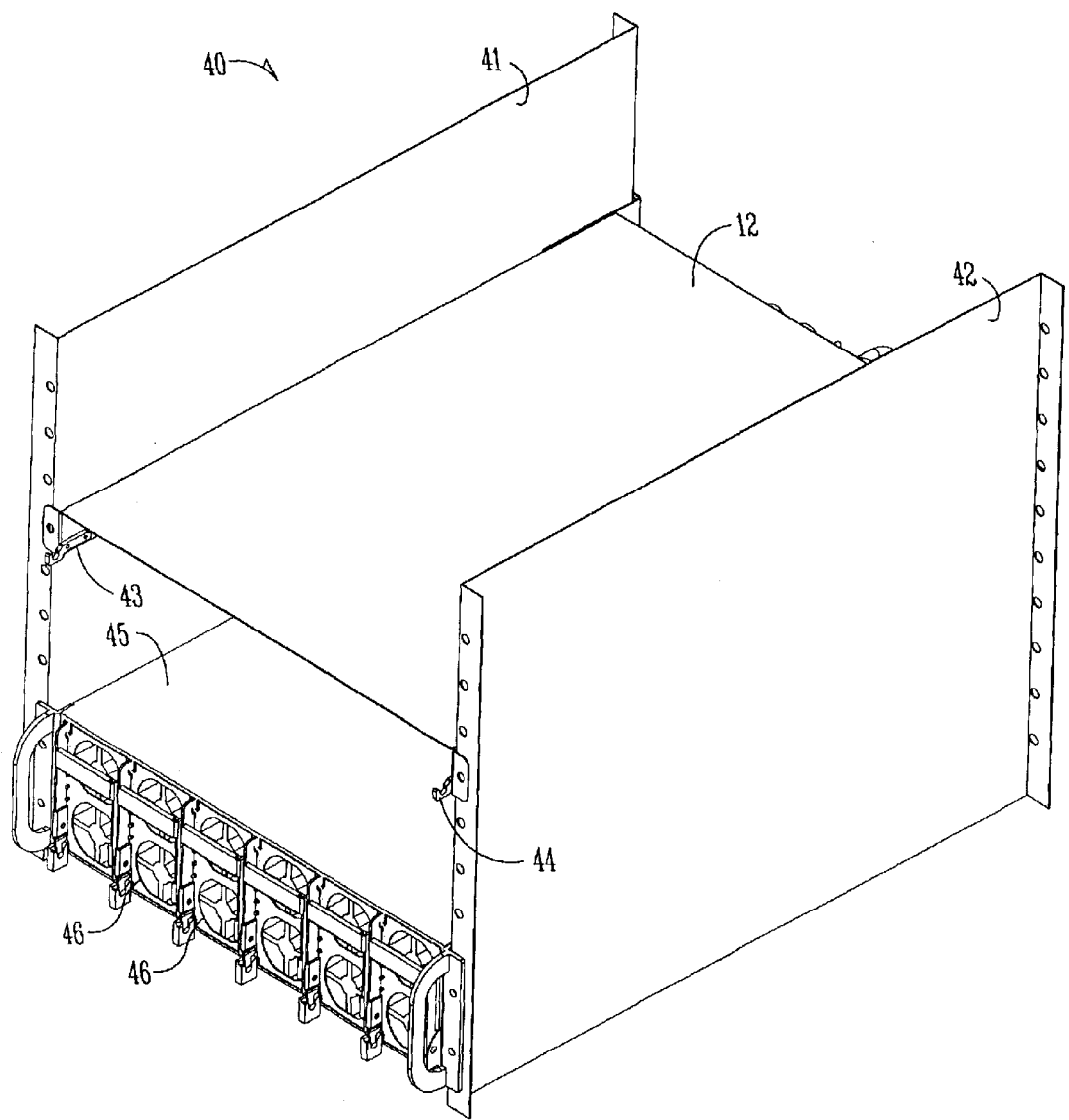
FIG. 4 is a front perspective view of a portion of a server rack, including a fixed electronics tray cover, in accordance with one embodiment of the invention.

FIG. 4 is a front perspective view of a portion of a server rack 40, including a fixed electronics tray top cover 12, in accordance with one embodiment of the invention. While only one e-tray top cover 12 is shown in FIG. 4 for ease of illustration, typically there are a number of e-tray covers 12 mounted in server rack 40, one for each e-tray that needs to be inserted into server rack 40.

Server rack 40 comprises a pair of opposing sides 41 and 42. Each side 41 or 42 supports a respective sidewall 17 or 18 (FIG. 2) of e-tray top cover 12. In turn, the sidewall 17 or 18 of each e-tray top cover 12 has a suitable mounting element to couple it to the outside of the corresponding side 13 or 14, respectively, of e-tray 10 (FIG. 3). In one embodiment, the mounting elements comprise mating drawer glides. An outer drawer glide 43 and 44 is mounted to the inside surface of each sidewall 17 or 18, respectively, of e-tray top cover 12. Alternatively, the mounting elements could be mounted directly to the inside surfaces of sides 41 and 42, respectively, of server rack 40.

Also seen in FIG. 4 is a power supply module 45 comprising a plurality of cooling fan inlets or vents 46.

Server rack 40 can also include other elements that are not illustrated in FIG. 4 for ease of illustration, such as a wheeled base, fascia panels, a top panel, or the like, none of which are germane to the present disclosure.

Figure 5:
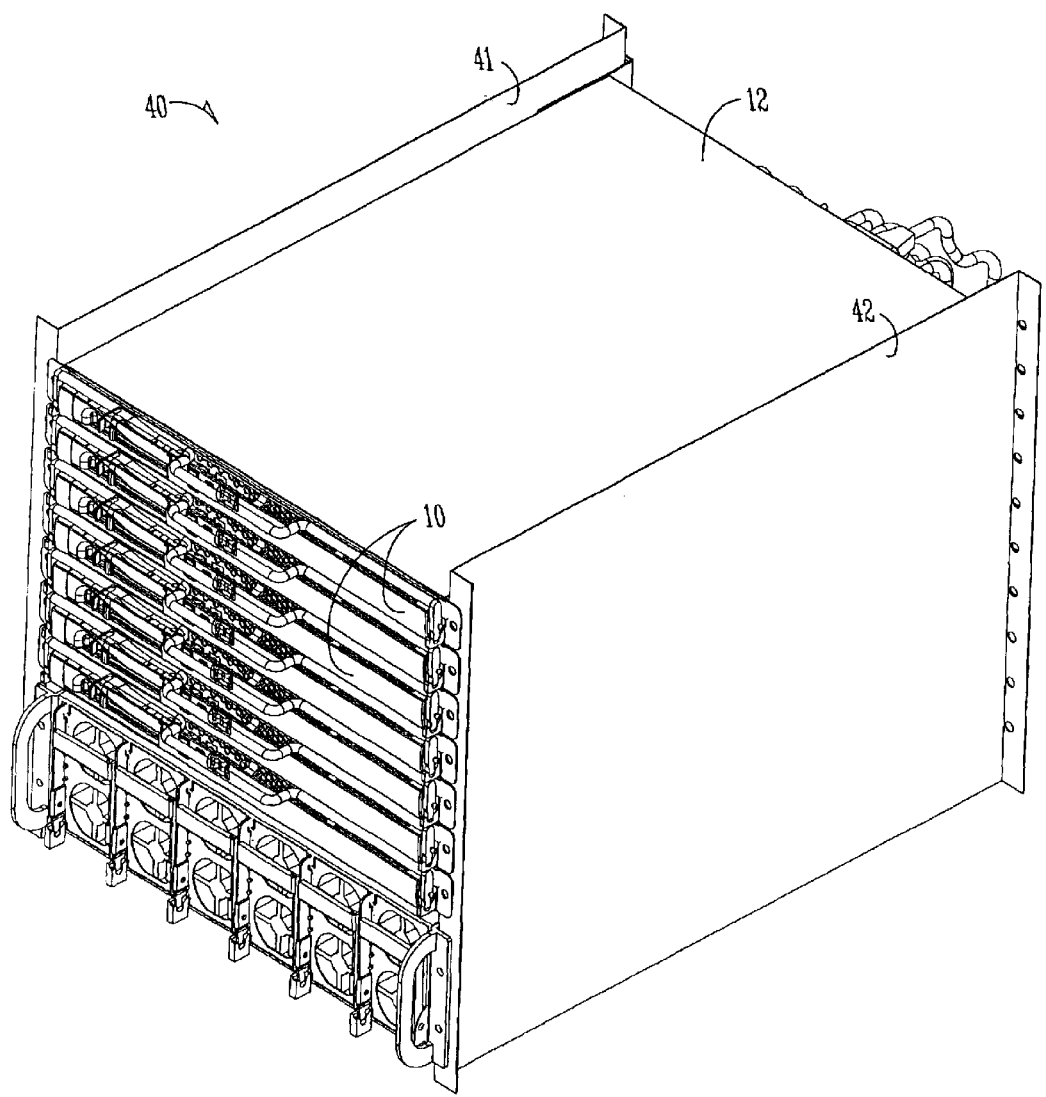
FIG. 5 is a front perspective view of a server rack, in accordance with one embodiment of the invention.

FIG. 5 is a front perspective view of a server rack 40, in accordance with one embodiment of the invention. The server rack 40 seen in FIG. 5 is a fully populated version of the server rack 40 shown in FIG. 4. In FIG. 5, server rack 40 comprises a plurality of e-trays 10, all of which are shown to be fully inserted into server rack 40. E-trays 10 are removably mounted between the sides 41 and 42 of server rack 40 and, more specifically, between the sidewalls of their respective e-tray too covers (e.g. top cover 12, FIG. 4). Also shown in FIG. 5 is the top cover 12 for the uppermost e-tray 10 in server rack 40. Top cover 12 provides EMI shielding, protection from environmental factors, and a safety enclosure for e-tray 10. Each e-tray 10 in server rack 40 has a corresponding top cover 12.

Figure 6:
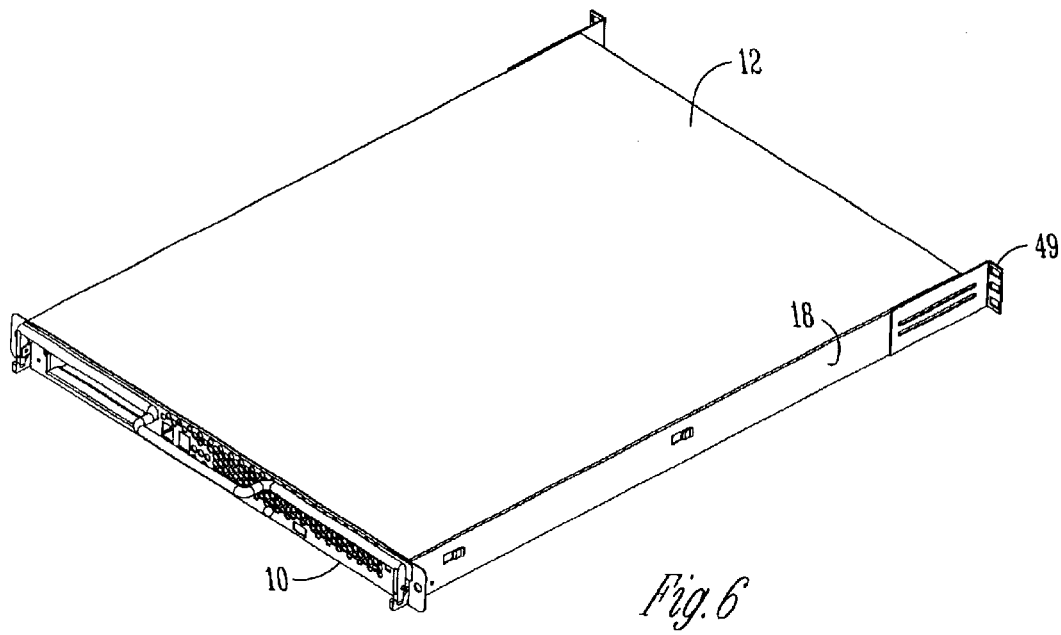
FIG. 6 is a front perspective view of an electronics tray within a tray cover, in accordance with one embodiment of the invention.

FIG. 6 is a front perspective view of an electronics tray 10 within a tray top cover 12, in accordance with one embodiment of the invention. The view of e-tray 10 in FIG. 6 is similar to that of e-tray 10 in FIG. 2, except that in FIG. 5 e-tray 10 is positioned fully within tray top cover 12. Also, as seen in FIG. 6, the side or sidewall 18 of top cover 12 can include a flange 49 or other suitable element with which to secure top cover 12 to server rack 40 (FIG. 5) using suitable fasteners (not shown).

Figure 7:
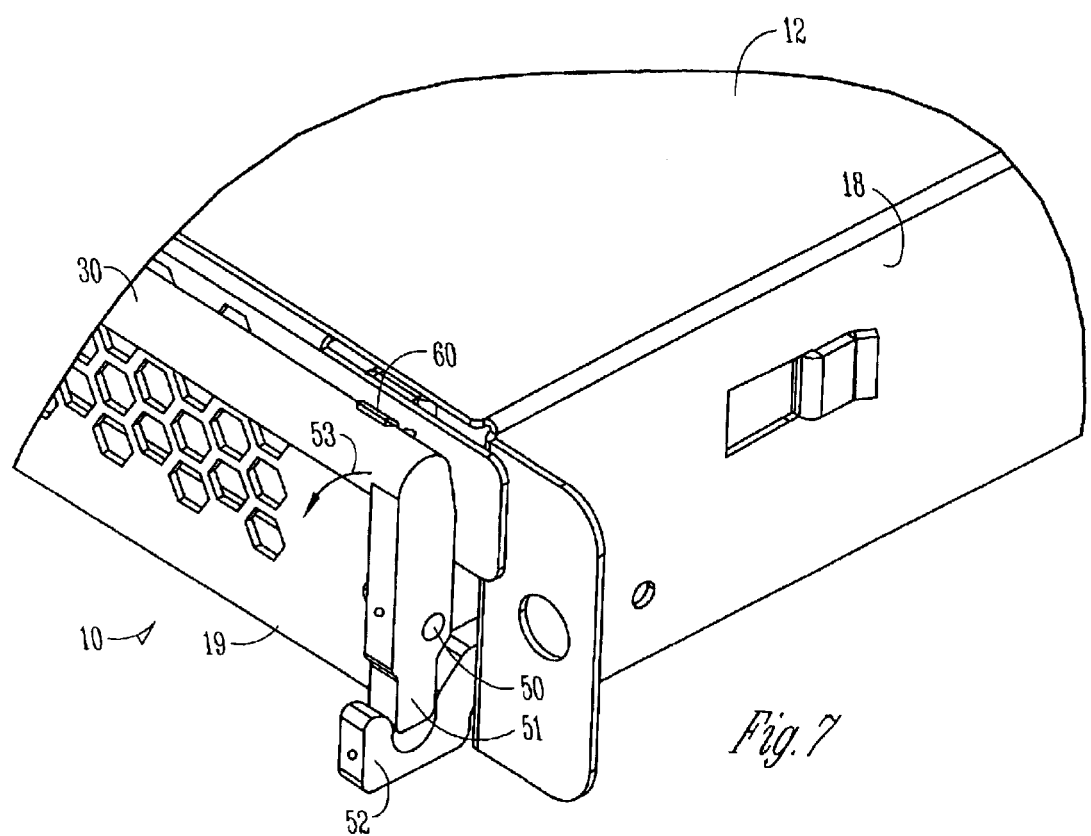
FIG. 7 is a front perspective view of a portion of an electronics tray in which an insertion/extraction element is in a first position, in accordance with one embodiment of the invention.

FIG. 7 is a front perspective view of a portion of an electronics tray 10 in which an insertion/extraction element is in a first position, in accordance with one embodiment of the invention. To provide the reader with a proper understanding of the location of the insertion/extraction element, FIG. 7 shows a portion of electronics tray 10 and a portion of top cover 12.

The insertion/extraction element comprises, in this embodiment, a cam member or cam arm 51 on the end of handle 30. When handle 30 is pulled in the direction indicated by arrow 53, cam arm 51 swivels about shaft 50. Shaft 50 is affixed to the front panel 19 of Stray 10 by a bracket (not visible in FIG. 7 but viewable in FIG. 9).

Cam arm 51 engages an engaging element on the server rack. In the embodiment illustrated in FIG. 7, the engaging element is a cam receiver 52, which is affixed to the inside surface of sidewall 18 of top cover 12. When handle 30 is pulled in the direction indicated by arrow 53, it will cause e-tray 10 to be pulled out of top cover 12.

Figure 8:
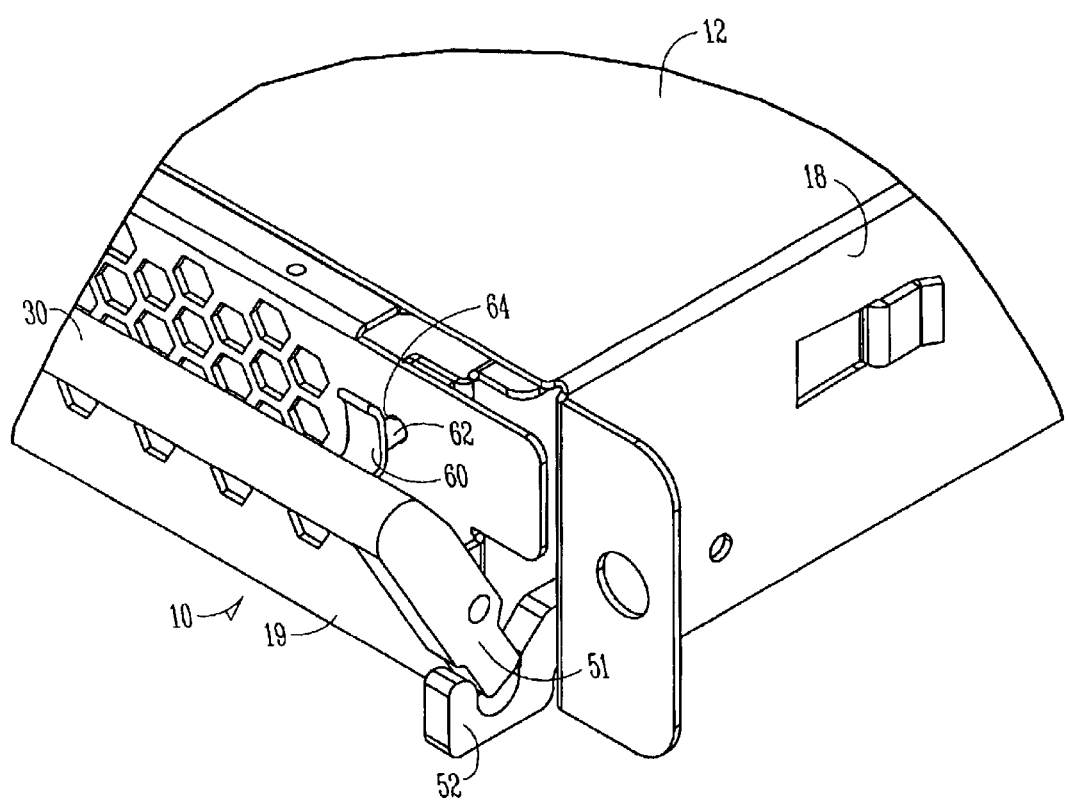
FIG. 8 is a front perspective view of a portion of an electronics tray in which an insertion/extraction element is in a second position, in accordance with one embodiment of the invention.
Figure 9:
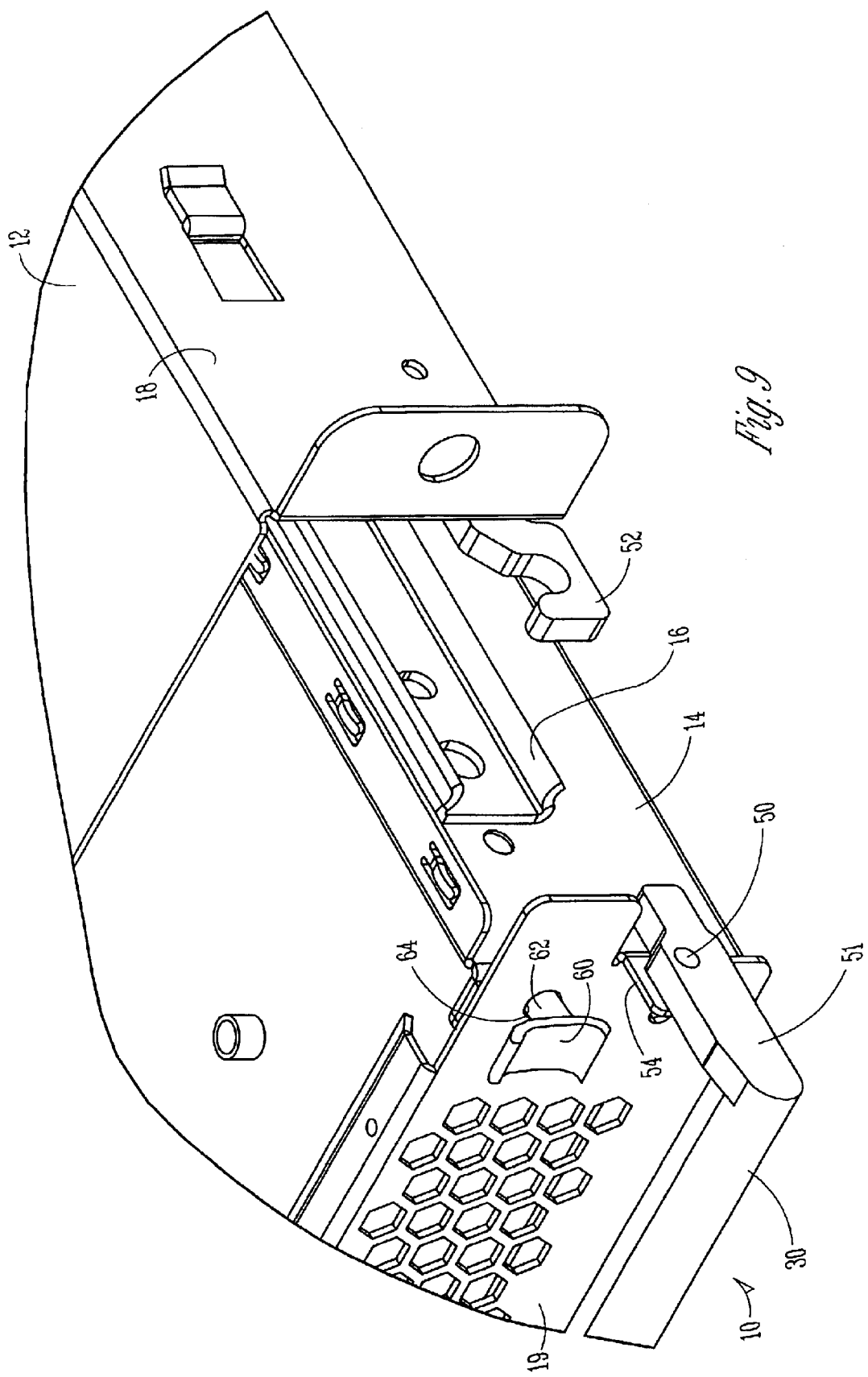
FIG. 9 is a front perspective view of a portion of an electronics tray in which an insertion/extraction element is in a third position, in accordance with one embodiment of the invention.

Also, barely perceptible in FIG. 7, but more apparent in FIGS. 8 and 9, is a portion of switch arm 60, which is engaged by handle 30 when handle 30 is in the upright position as shown in FIG. 7.

The insertion/extraction mechanism provides a significant mechanical advantage to overcome high frictional forces that often occur between mating connectors on the server rack and e-tray, such as between cable plugs on the rack and electrical receptacles on the e-tray.

FIG. 8 is a front perspective view of a portion of an electronics tray 10 in which an insertion/extraction element is in a second position, in accordance with one embodiment of the invention. In FIG. 8, handle 30 has been pulled down approximately halfway between the upright position shown in FIG. 7 and the position shown in FIG. 9.

Visible in FIG. 8 is switch arm 60, which can be contoured to the shape of handle 30. Switch arm 60 is coupled to a switch shaft 62 that passes through aperture 64 in the front panel 19 of e-tray 10 and connects with switch 66 (FIG. 10).

FIG. 9 is a front perspective view of a portion of an electronics tray 10 in which an insertion/extraction element is in a third position, in accordance with one embodiment of the invention. In FIG. 9, handle 30 has been pulled all of the way down, so that cam arm 51 is no longer engaged with cam receiver 52.

Bracket 54 affixed to the front panel 19 of e-tray 10 serves as a support for shaft 50, about which cam arm 51 pivots when handle 30 is moved.

Figure 10:
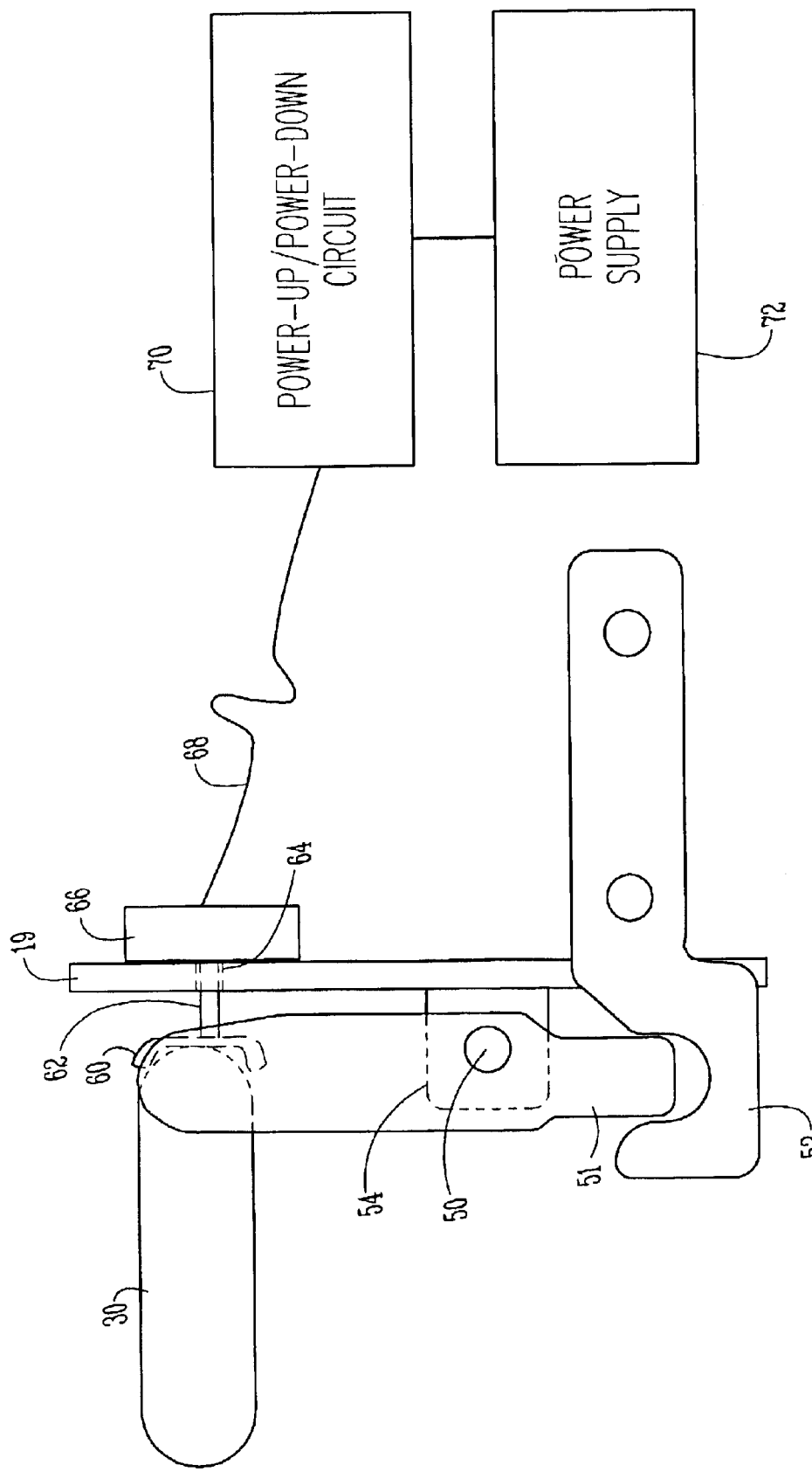
FIG. 10 is a side view of a handle of an electronics tray in a fully upright position in which the switch arm of a switch is depressed, and FIG. 10 further shows a power-up/power-down circuit, in accordance with one embodiment of the invention.

FIG. 10 is a side view of a handle 30 of an electronics tray in a fully upright position in which switch arm 60 of switch 66 is depressed, and FIG. 10 further shows a power-up/power-down circuit 70, in accordance with one embodiment of the invention. Switch arm 60 is coupled to switch 66 via a switch shaft 62 that passes through aperture 64 in the front panel 19 and connects with switch 66. Switch 66 can be any of suitable type, such as a micro-switch. In other embodiments, switch 66 can be actuated by any other appropriate kind of movement sensor, such as a magnetic element, pneumatic element, pressure transducer, light-beam interrupter, radio-frequency (RF) device, or the like.

While switch 66 is shown close to handle 30 in the embodiment illustrated in FIG. 10, in other embodiments, the movement sensor or switch could be located on the handle 30 itself, elsewhere on the e-tray, or elsewhere in the server rack. For example, it could be located at the rear of the e-tray.

Switch 66 is coupled via a link 68 to a power-up/power-down circuit 70. Link 68 can be of any suitable type, such as an electrically conductive bus or cable, fiber optic cable, RF or infrared link, or the like, depending in part upon the type of switch 66 employed. Switch 66 transmits an "E-Tray In" signal via link 68 when handle 30 is in the fully upright position, and switch 66 transmits an "E-Tray Out" signal when handle 30 has been moved from the fully upright position.

Power-up/power-down circuit 70 is coupled to power supply 72. Power-up/power-down circuit 70 is responsive to the E-Tray In signal to initiate a power-up sequence, coupling electrical power having the proper parameters to the electrical component(s) on the e-tray. Likewise, power-up/power-down circuit 70 is responsive to the E-Tray Out signal to initiate a power-down sequence, uncoupling electrical power from the electrical component(s) on the e-tray. It is well within the skill of those of ordinary skill in the art to design an appropriate power-up/power-down circuit 70. The response characteristics of power-up/power-down circuit 70 can be tuned so that a power-down sequence is initiated within a very short time after handle 30 is pulled, e.g. within 300 milliseconds.

By ensuring that power is not turned on while the e-tray is inserted or removed, the potential for damage to electronic components on the e-tray and/or to the connector terminals of receptacles and cable plugs (such as those illustrated in FIGS. 11–15) is substantially reduced. In addition, because it is impossible to remove the e-tray without shutting down the power, the margin of safety for operational personnel is enhanced, which is particularly important for e-trays whose top covers remain in the server rack when the e-trays are removed.

Figure 11:
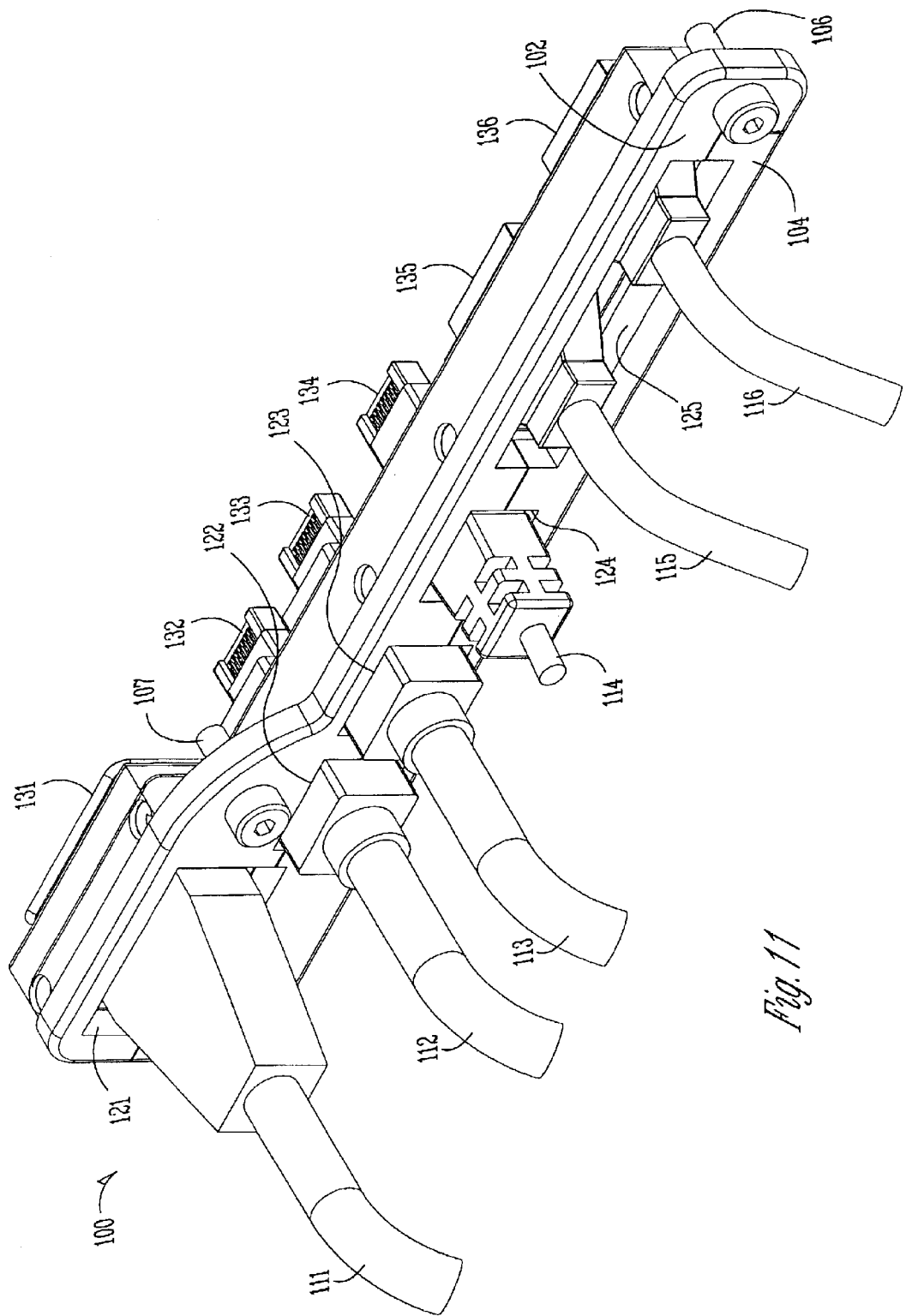
FIG. 11 is a rear perspective view of a cable-clamping mechanism, in accordance with one embodiment of the invention.

FIG. 11 is a rear perspective view of a cable-clamping mechanism 100, in accordance with one embodiment of the invention. Cable-clamping mechanism 100 comprises a pair of mating elements 102 and 104. Mating elements 102 and 104 have formed therein a plurality of openings 121–125. Certain ones of openings 121–125 have differing physical dimensions in the embodiment shown in FIG. 11, but in alternative embodiments they could all have the same physical dimensions. Openings 121–124 accommodate cable plugs 131–134 of cables 111–114, respectively, and opening 125 accommodates two cable plugs 135–136 of cables 115–116.

One or more securing elements in the form of fasteners 106 and 107 secure cable-clamping mechanism 100 to a structural member at the rear of the server rack. In the embodiment illustrated in FIGS. 14 and 15, the structural member comprises rear panel 34 of top cover 12; however, a different structural member could be used in another embodiment. Because cable-clamping mechanism 100 is secured to the electronics rack assembly via top cover 12, cable plugs 131–136 are firmly held in place when corresponding mating receptacles at the rear of the e-tray are inserted into cable plugs 131–136, as the e-tray is inserted into the electronics rack assembly, as will be seen in greater detail below regarding FIGS. 14 and 15.

Figure 12:
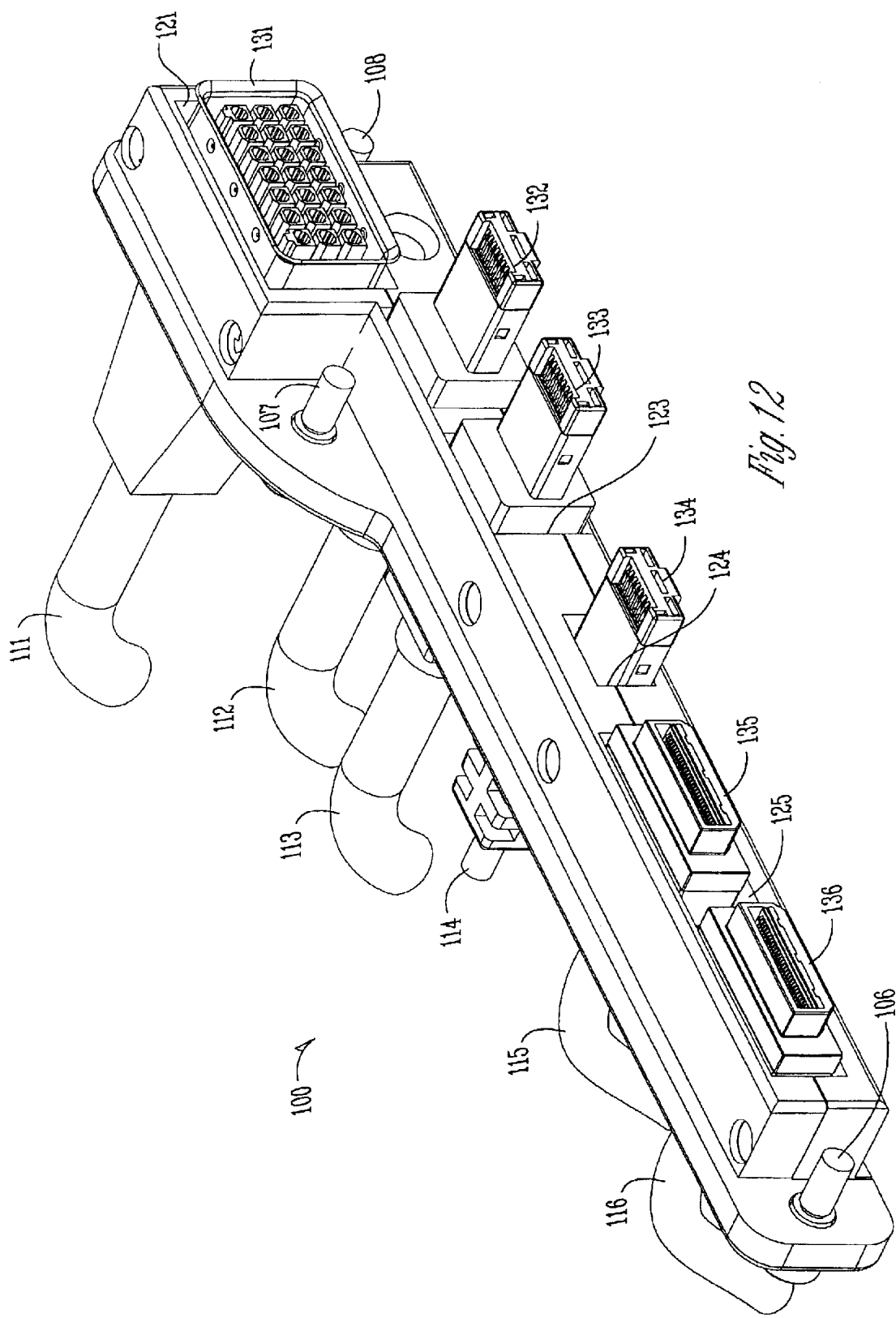
FIG. 12 is a front perspective view of a cable-clamping mechanism, in accordance with one embodiment of the invention.

FIG. 12 is a front perspective view of a cable-clamping mechanism 100, in accordance with one embodiment of the invention. The view of cable-clamping mechanism 100 in FIG. 12 is from the opposite side of that seen in FIG. 11.

Otherwise, all elements in FIG. 12 are substantially as shown in FIG. 11. Also seen in FIG. 12 is an additional fastener 108, which can be like fasteners 106 and 107. In one embodiment, fasteners 106–108 are shoulder screws. Fasteners 106–108 preferably provide a degree of "float" or tolerance between the cable plugs of cable-clamping mechanism 100 and their mating receptacles 101 at the rear of e-tray 10, in order to accommodate variability and tolerances in the assembly parts. It will be seen from FIG. 12 that cable plugs 132–134 are multi-terminal and of a first gender (male), whereas cable plugs 135 and 136 are multi-terminal and of a second gender (female).

Figure 13:
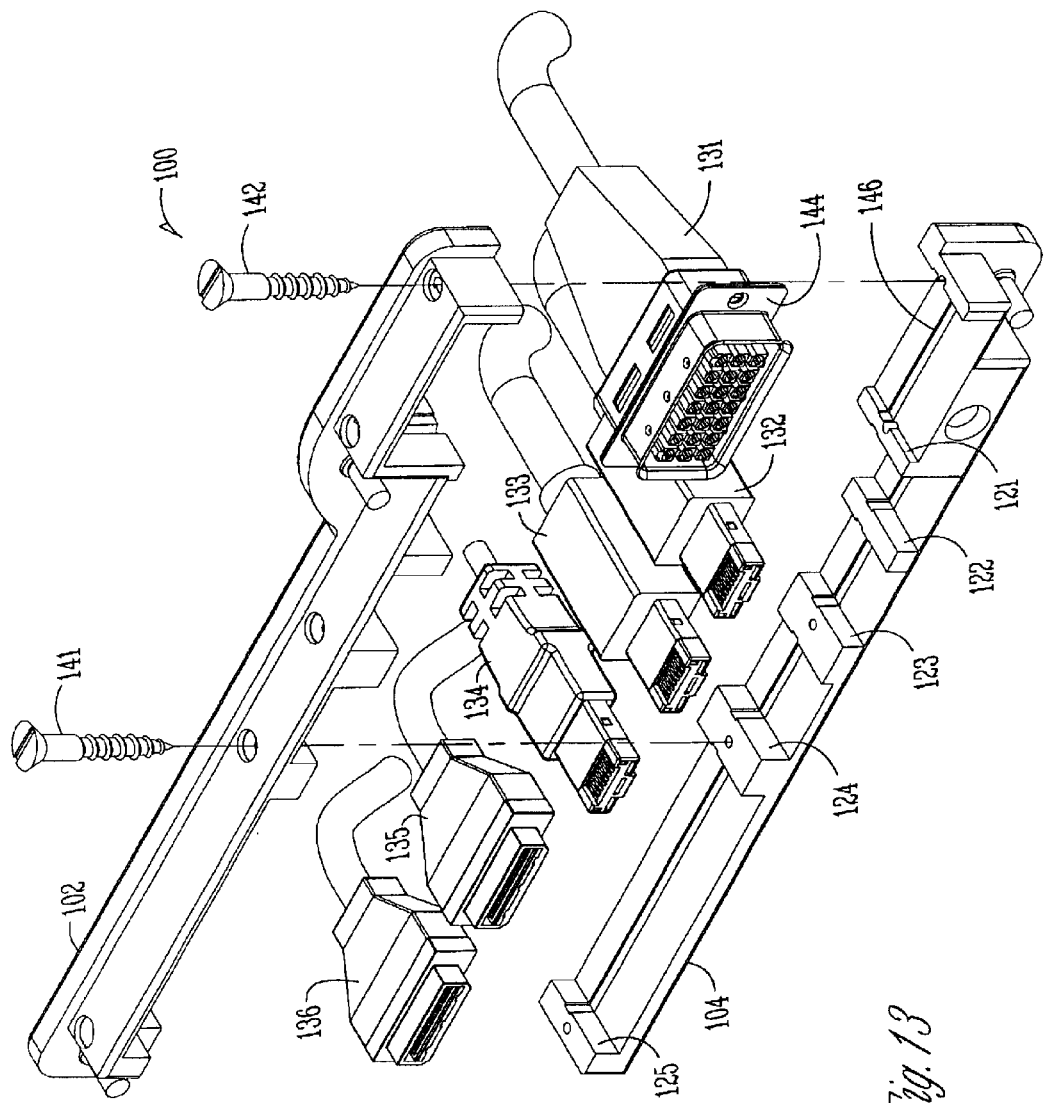
FIG. 13 is an exploded front perspective view of a cable-clamping mechanism, in accordance with one embodiment of the invention.

FIG. 13 is an exploded front perspective view of a cable-clamping mechanism 100, in accordance with one embodiment of the invention. The view of cable-clamping mechanism 100 in FIG. 13 is from the same side as that in FIG. 12; however, the perspective is from the other end of cable-clamping mechanism 100. The openings 121–125 within mating elements 102 and 104 can be clearly seen in FIG. 13.

Opening 121 comprises a retention element in the form of groove 146. Groove 146 mates with a corresponding retention element in the form of a ridge 144 of cable plug 131 to help maintain cable plug 131 in a fixed position within opening 121 of cable-clamping mechanism 100, particularly when insertion or withdrawal forces are applied to cable plug 131.

Fastening elements, such as screws 141–142, can be employed to fasten mating elements 102 and 104 together. Only two screws 141–142 are shown here for ease of illustration.

Figure 14:
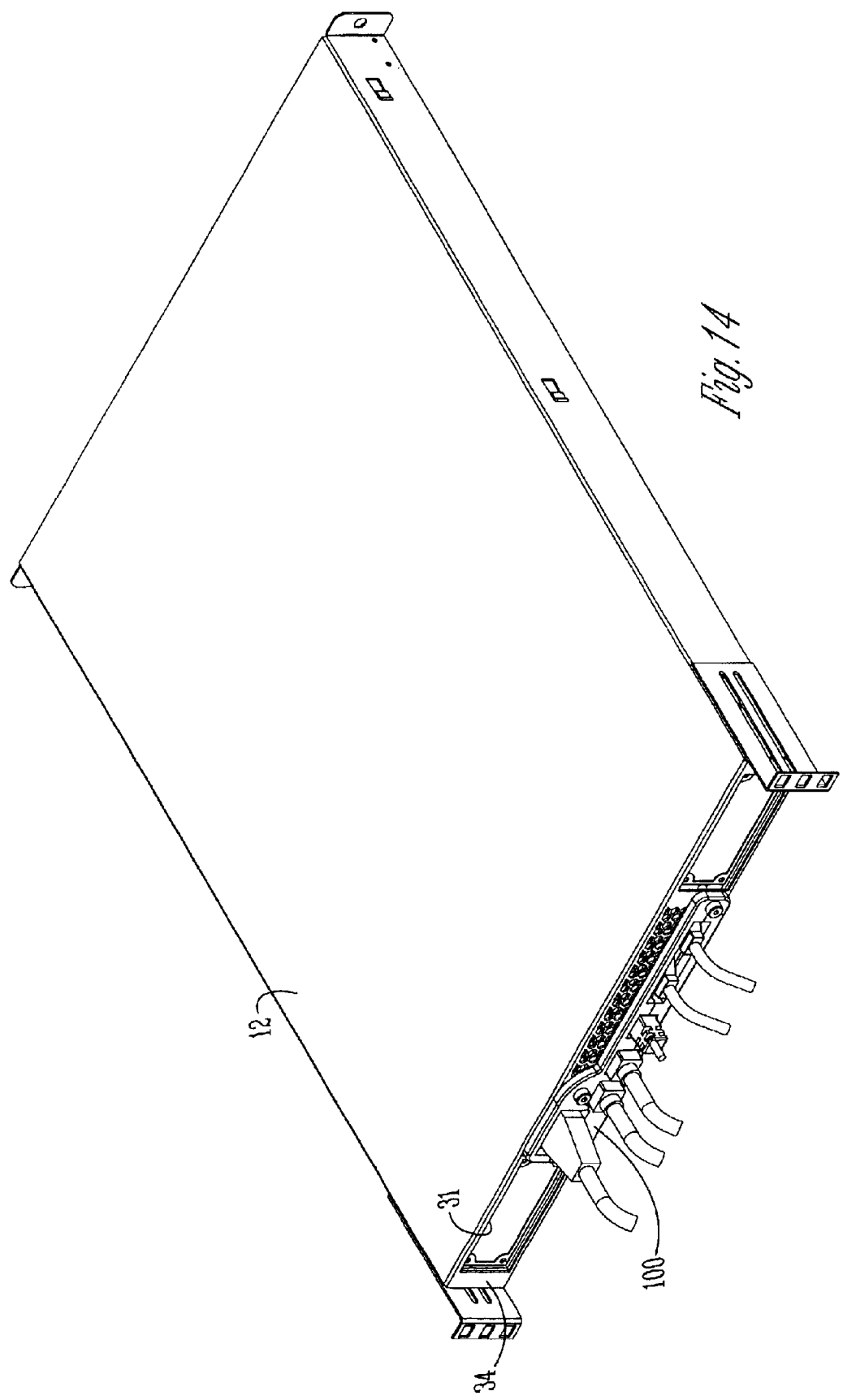
FIG. 14 is a rear perspective view of an electronics tray having electrical receptacles that are completely inserted into corresponding cable plugs of a cable-clamping mechanism, in accordance with one embodiment of the invention.

FIG. 14 is a rear perspective view of an electronics tray top cover 12 having electrical receptacles (not shown) that are completely inserted into corresponding cable plugs (not shown) of a cable-clamping mechanism 100, in accordance with one embodiment of the invention.

In FIG. 14, a structural member in the form of top cover rear panel 34 at the rear of the server rack supports cable-clamping mechanism 100. If a structural member other than rear panel 34 is used, it can be secured at any convenient location, such as between the sides 41–42 (FIG. 4) of server rack 40 or, in an embodiment where top cover has no rear panel, between the sidewalls 17–18 (FIG. 2) of top cover 12 (FIG. 2).

Figure 15:
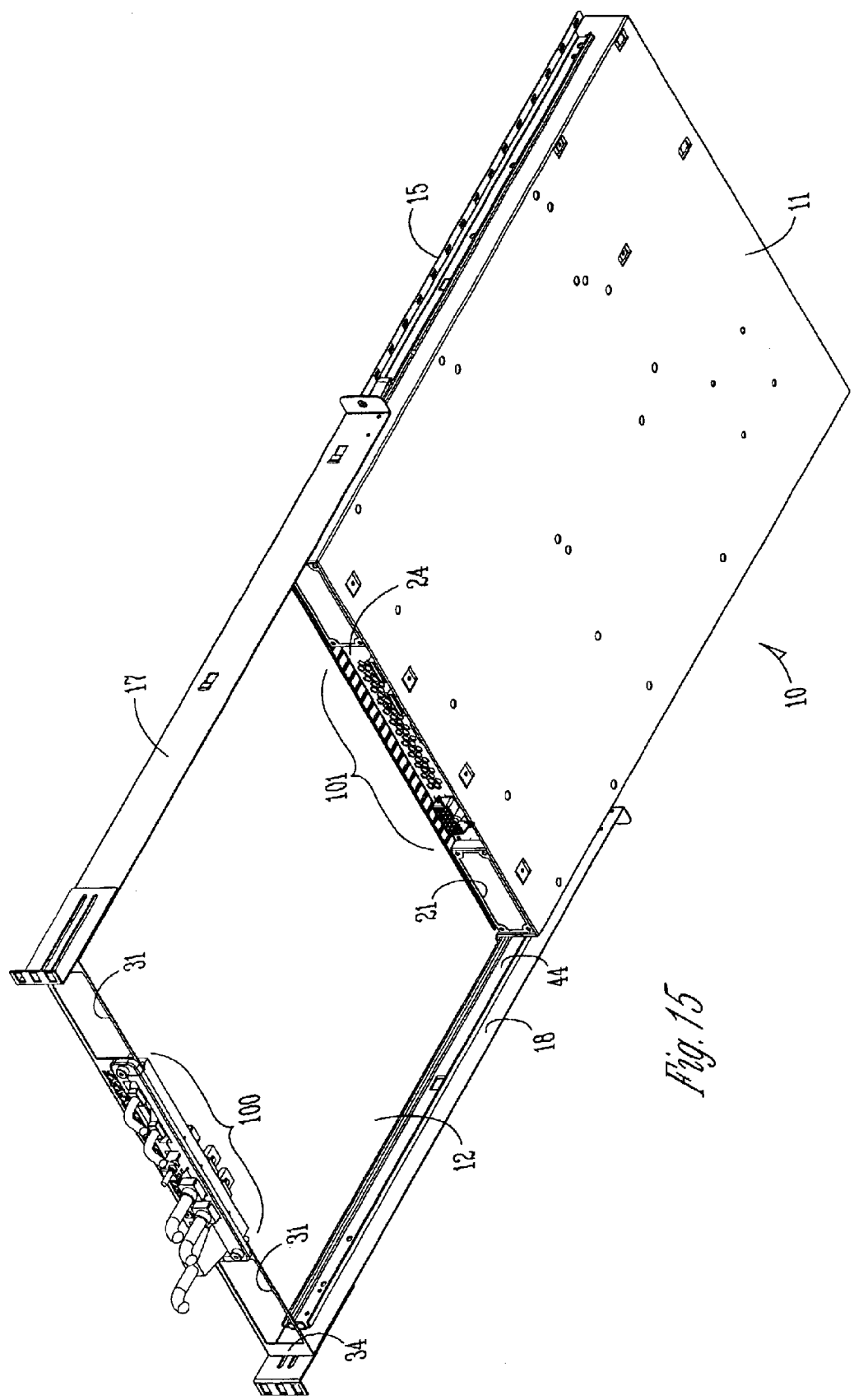
FIG. 15 is a rear perspective view of an electronics tray having electrical receptacles that are completely removed from corresponding cable plugs of a cable-clamping mechanism, in accordance with one embodiment of the invention.

FIG. 15 is a rear perspective view of an electronics tray 10 having multi-terminal electrical receptacles 101 that are completely removed from corresponding multi-terminal cable plugs of a cable-clamping mechanism 100, in accordance with one embodiment of the invention. The view in FIG. 15 is looking up at the bottom 11 of e-tray 10. E-tray 10 has been withdrawn sufficiently to decouple receptacles 101 from the cable plugs of cable-clamping mechanism 100, but e-tray 10 has not been completely withdrawn from top cover 12. In an embodiment, one or more cable plug(s) of cable-clamping mechanism 100 may be of either a first or second gender, and the corresponding electrical receptacles of the electrical receptacles 101 may be of the appropriate matching gender.

Also seen in FIG. 15 is the outer member 44 of a drawer glide on the inside surface of sidewall 18 of top cover 12. If desired, suitable drawer-retaining elements can be provided on the e-tray 10 to prevent its removal from the drawer glides of top cover 12 without positive human intervention, e.g. by depressing or lifting appropriate detents, catches, or tabs (not shown).

Rear panel 34, having airflow openings 31, provides support for cable-clamping mechanism 100.

Figure 1:
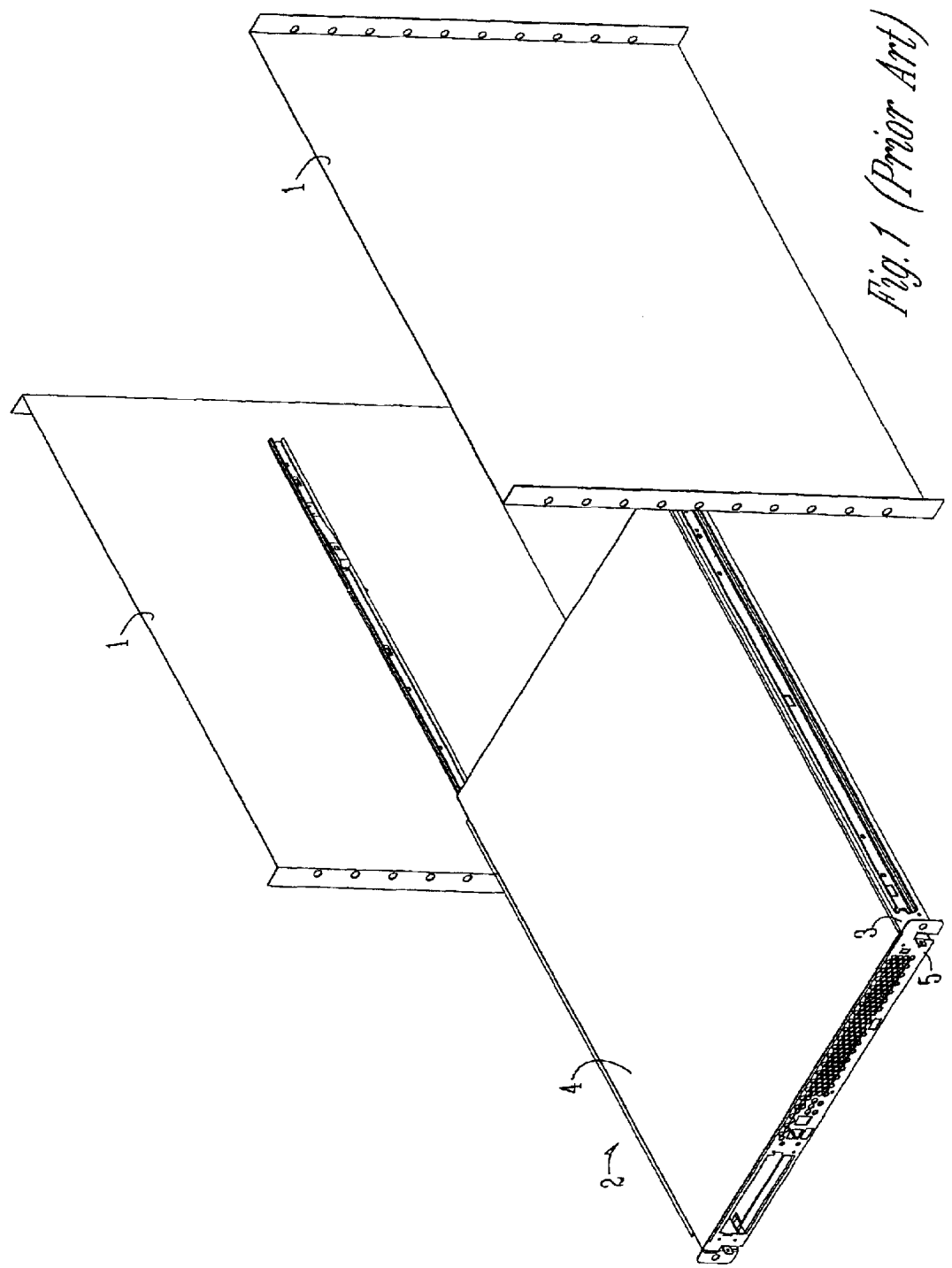
FIG. 1 is a perspective view of a portion of a prior art server rack and electronics tray.
Figure 16:
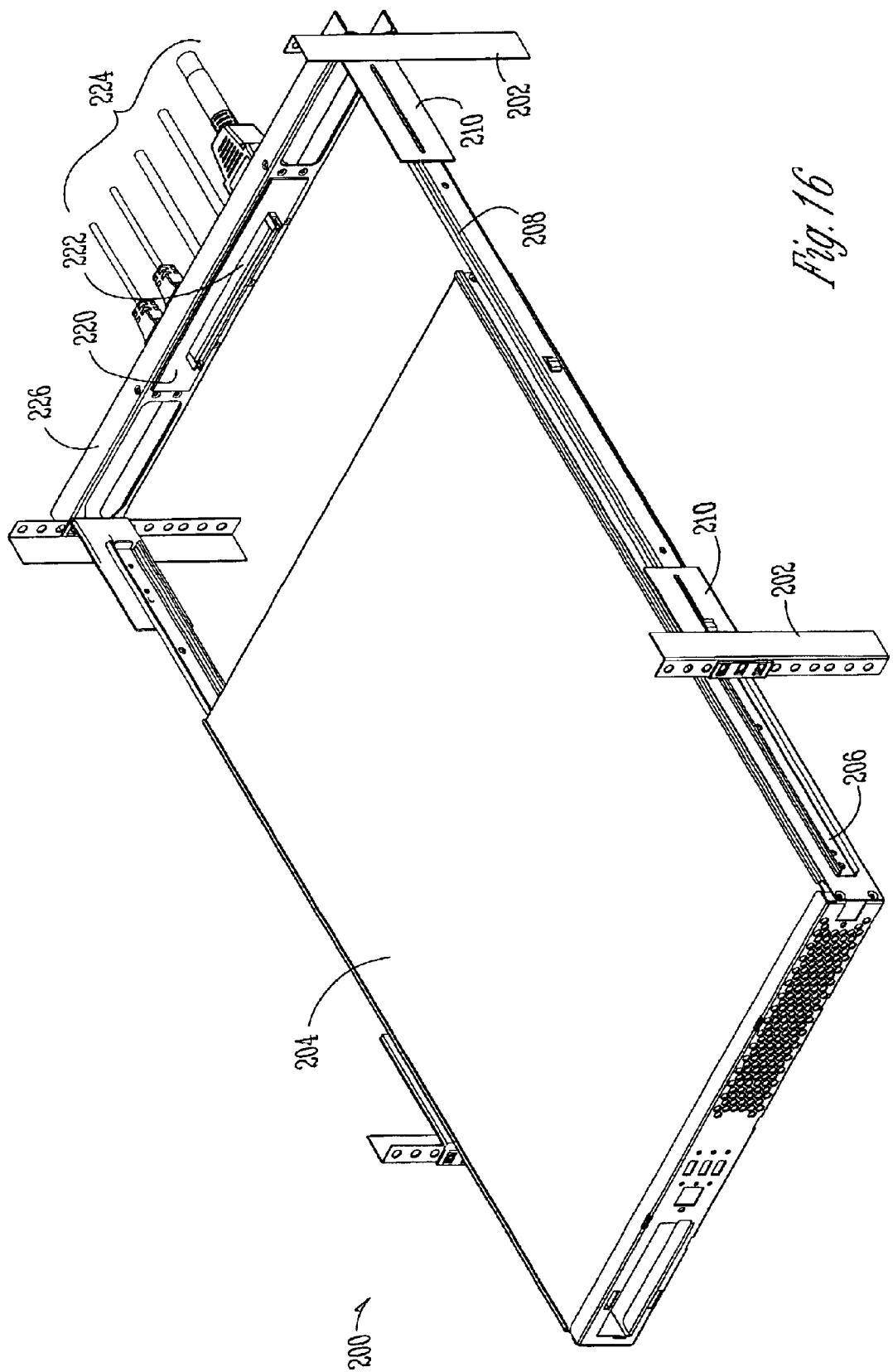
FIG. 16 is a front perspective view of a portion of a server rack having an integral connector to couple to an electronics tray, in accordance with an embodiment of the invention.

FIG. 16 is a front perspective view of a portion of a server rack 202 having an integral connector 222 to couple to an electronics tray 200, in accordance with an embodiment of the invention. In this embodiment, electronics tray 200 can be similar or identical to a prior art electronics tray, such as electronics tray 2 illustrated in FIG. 1, in that electronics tray 200 has a top cover 204 that remains in place on electronics tray 200 when electronics tray 200 is withdrawn from the server rack 202.

However, in other embodiments, electronics tray 200 can be of the same type as electronics tray 10 illustrated in FIG. 2, for example, having a top cover 12 that is affixed to the server rack 40 and that remains in place on the server rack 40 when the electronics tray 10 is withdrawn from the server rack 40.

Electronics tray 200 can be slide into and out of server rack 202 through the use of suitable drawer glides, such as inner-drawer glide 206 on electronics tray 200 and outer drawer glide 208 mounted on side structural members or side panels 210 of server rack 202.

In this embodiment, a single integral connector 222 is mounted on an adapter card 220, which in turn is mounted on a rear structural member or rear panel 226. A plurality of various cables 224 are coupled to the rear side (refer to FIG. 19) of adapter card 220. When electronics tray 200 is inserted into server rack 202, a single integral connector 222 is mated to a corresponding mating connector (not shown) at the rear of electronics tray 200.

The electronics tray connector can be of opposite "gender" to that of integral connector 222. In one embodiment, connector 222 is an edge connector, and its mating connector on electronics tray 200 comprises PCB traces on a protruding "tongue" at the rear of electronics tray 200 in an arrangement wherein each trace is gripped by an opposing pair of contacts within the edge connector when the tongue is inserted into the edge connector.

In another embodiment, connector 222 could be a D-type multi-pin connector, and its mating receptacle on electronics tray 200 could be a D-type multi-holed receptacle. However, embodiments of the invention are not limited to any particular type of connector or receptacle.

By reducing several diverse cable plugs down to a single integral connector 222, the insertion force and insertion tolerances are considerably reduced. In another embodiment, several groups of cable plugs could each be electrically coupled to a respective integral connector, i.e. a first group of cable plugs could be coupled to a first integral connector, a second group of cable plugs could be coupled to a second integral connector, and so forth.

Figure 17:
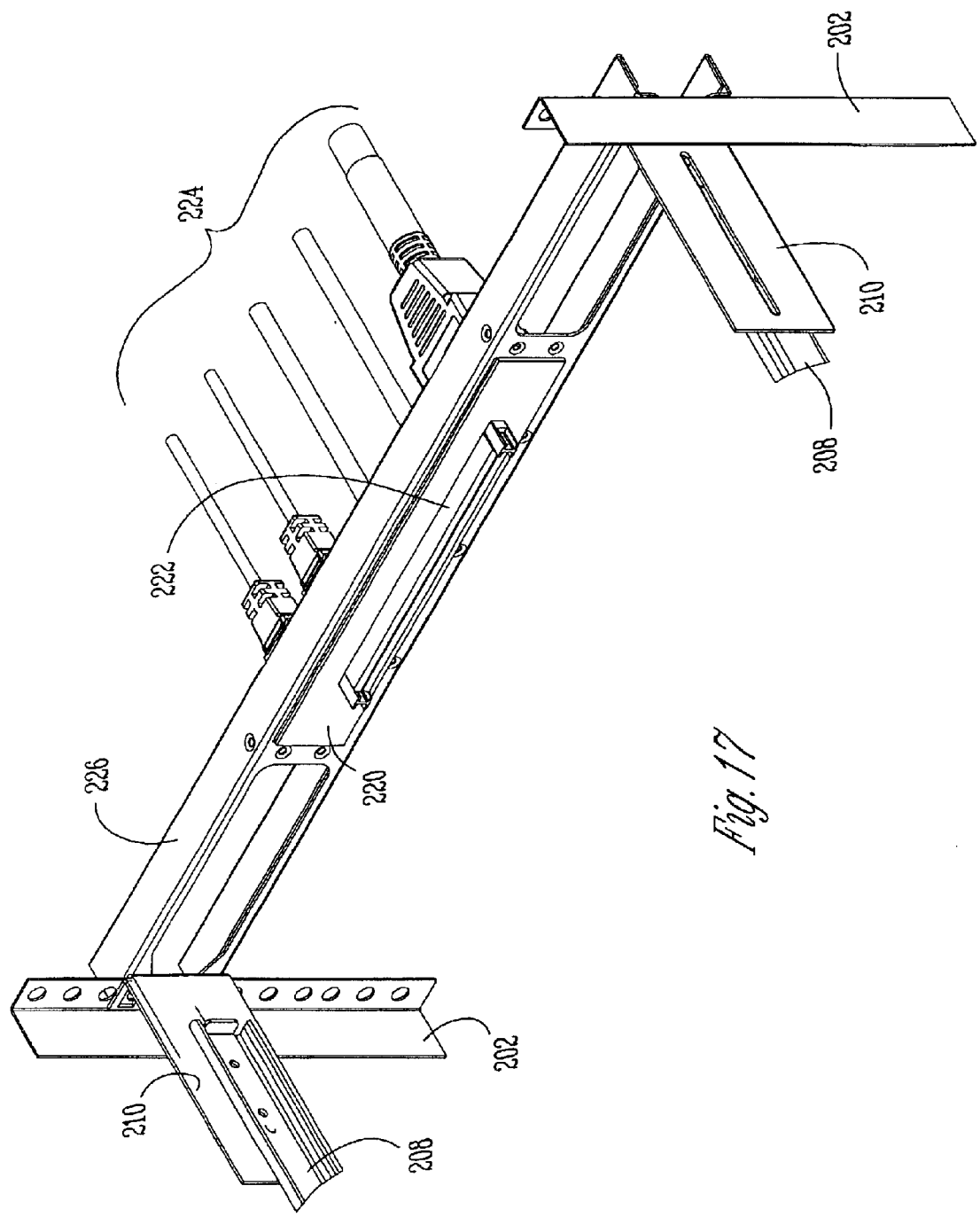
FIG. 17 is a zoomed-in front perspective view of the integral connector shown in FIG. 16 and of an adapter card on which the integral connector is mounted.

FIG. 17 is a zoomed-in front perspective view of the integral connector 222 shown in FIG. 16 and of an adapter card 220 on which the integral connector 222 is mounted. FIG. 17 shows slightly more detail of the integral connector 222 and adapter card 220 and how they are mounted on rear panel 226. Adapter card 220 is coupled to a corresponding aperture (not shown) in rear panel 220 in a manner that allows adapter card 220 to float and to provide a certain amount of horizontal and vertical insertion tolerance between integral connector 222 and its mating connector on the rear side of electronics tray 200.

Figure 18:
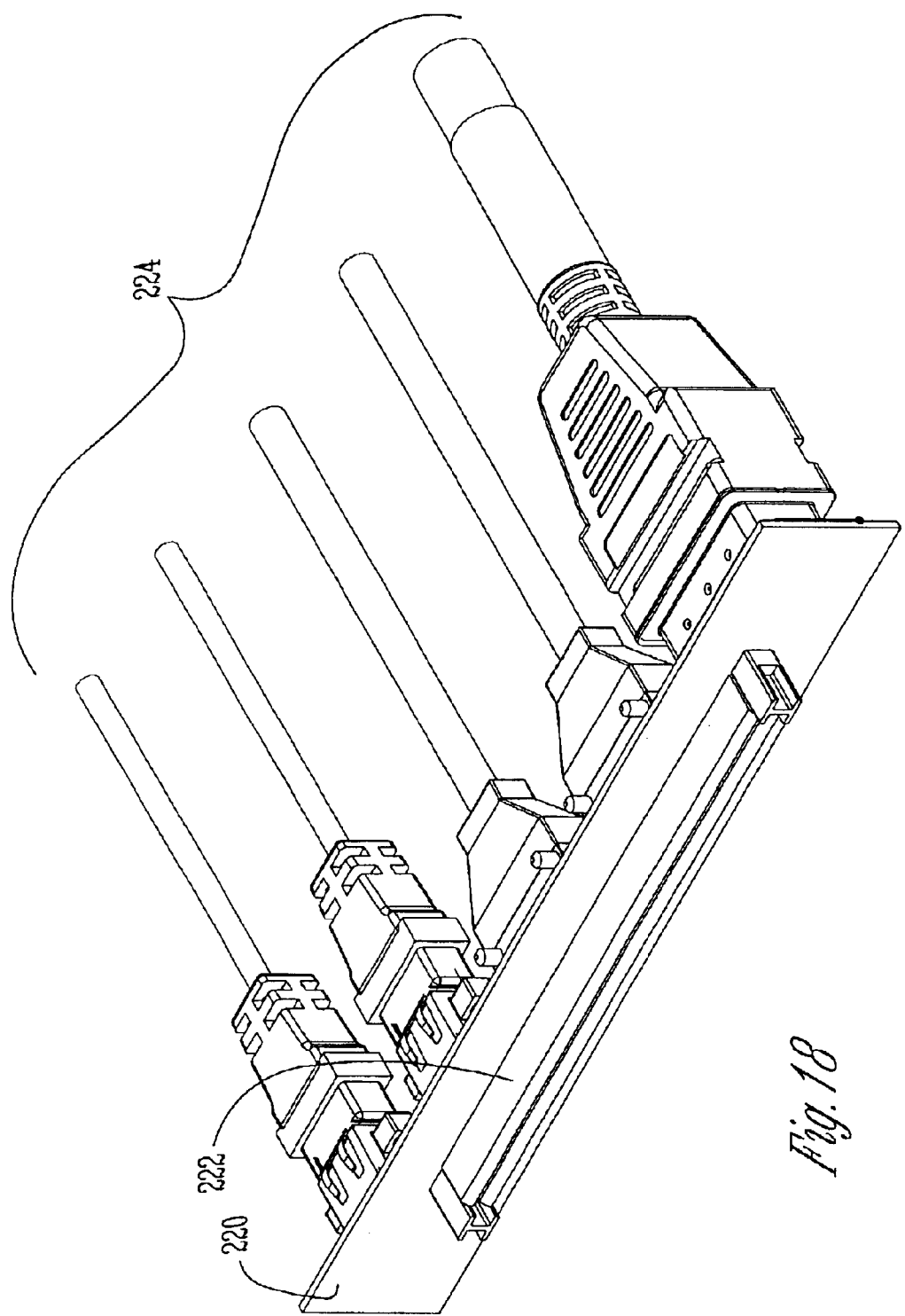
FIG. 18 is a front perspective view of the integral connector and adapter card shown in FIGS. 16 and 17.

FIG. 18 is a front perspective view of the integral connector 222 and adapter card 220 shown in FIGS. 16 and 17. FIG. 18 shows slightly more detail of the integral connector 222 and adapter card 220 in this particular view, in which adapter card 220 is not mounted on rear panel 226. Adapter card 220 can be a single-layered or multi-layered PCB or other substrate of any suitable material. The internal electrical traces of adapter card 220 serve to couple individual connective elements, such as pins or contacts, within integral connector 222 to corresponding connective elements within plug receptacles on the opposite side of integral connector 222 that mate with the cable plugs, as will be seen in greater detail in FIG. 19, which will now be described.

Figure 19:
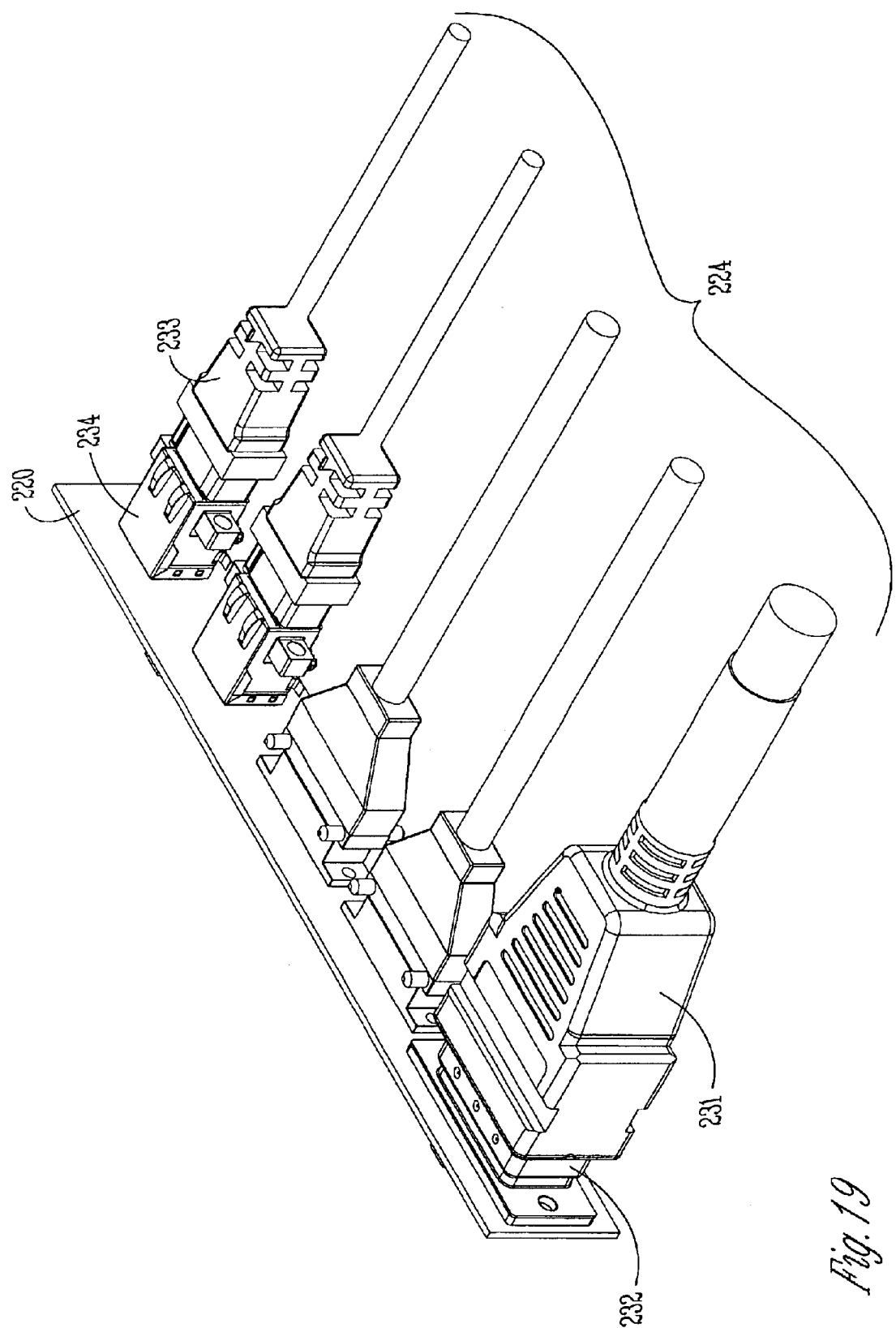
FIG. 19 is a rear perspective view of the integral connector and adapter card shown in FIG. 18 and of various cables plugged into corresponding connectors on the adapter card.

FIG. 19 is a rear perspective view of the adapter card 220 shown in FIG. 18 and of various cables 224 plugged into corresponding cable connectors on the adapter card 220. Adapter card 220 has a plurality of cable connectors, such as cable connectors 232 and 234, mounted on its rear side. Each cable connector, such as cable connectors 232 and 234, for example, mates with a corresponding cable plug, such as cable plugs 231 and 233, respectively. The cable plugs 231 and 233, and the cable connectors 232 and 234, shown in FIG. 19 are merely illustrative, and any types of cable plugs and cable connectors can be employed.

Figure 20:
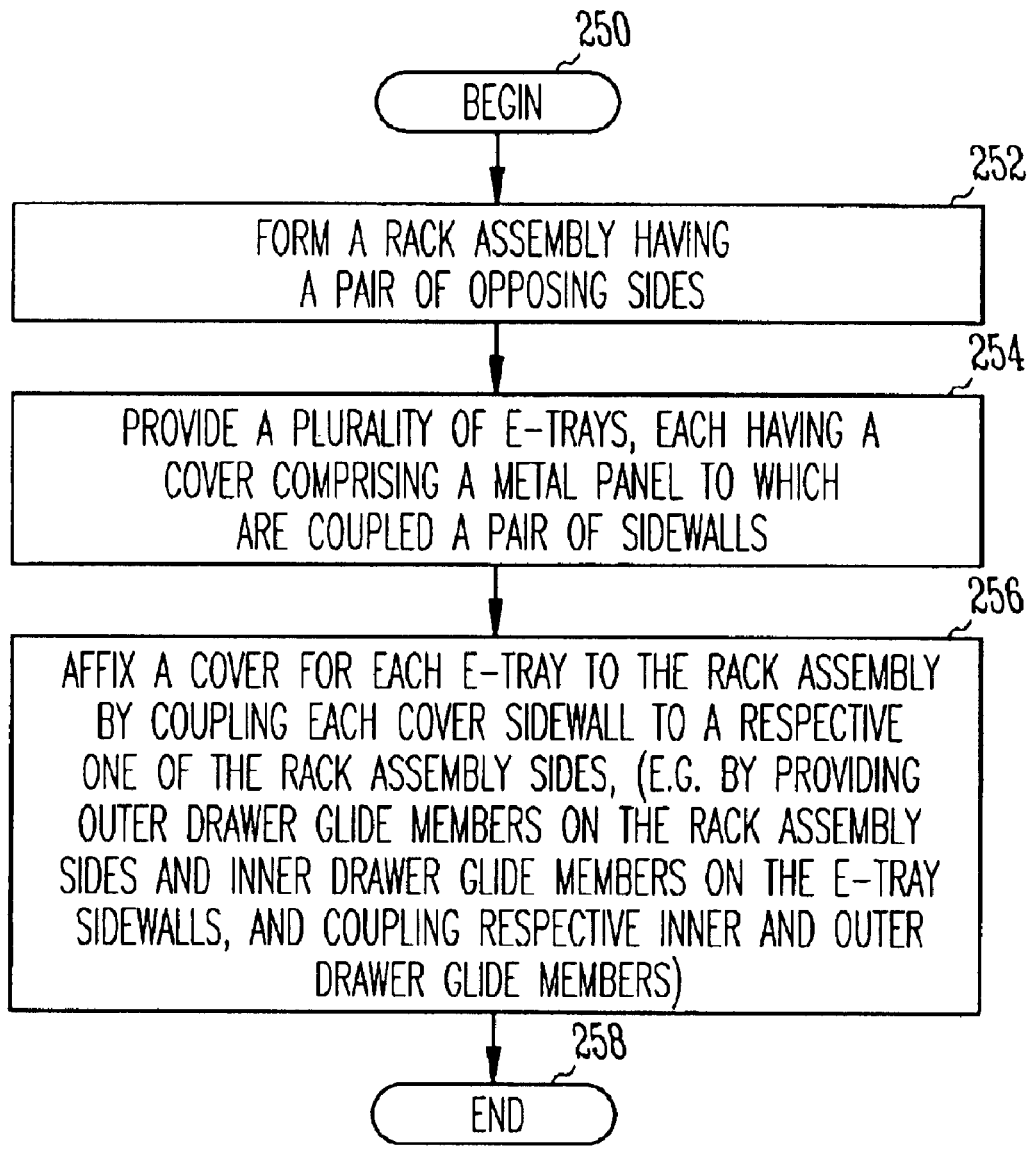
FIG. 20 is a flow diagram illustrating a method of forming an electronics rack assembly, in accordance with one embodiment of the invention.

FIG. 20 is a flow diagram illustrating a method of forming an electronics rack assembly, in accordance with one embodiment of the invention. The method begins at 150.

In 152, a rack assembly is formed having a pair of opposing sides (e.g. sides 41 and 42, FIG. 5).

In 154, a plurality of e-trays are provided (e.g. e-trays 10, FIG. 5). Each e-tray has a cover comprising a metal panel to which are coupled a pair of sidewalls (e.g. e-tray 10 having bottom panel 11 and sidewalls 13–14, FIG. 3).

In 156, a cover for each e-tray is affixed to the rack assembly by coupling each cover sidewall to a respective one of the rack assembly sides (e.g., to rack assembly sides 41–42, FIG. 4). In one implementation, for example, outer drawer glide members (e.g. outer drawer glides 43–44, FIG. 4) are provided on the rack assembly sides, and inner drawer glide members (e.g. inner drawer glides 15–16, FIG. 3) are provided on the e-tray sidewalls. The respective inner and outer drawer glide members are coupled (e.g. as illustrated in FIG. 2).

The operations described above with respect to the method illustrated in FIG. 20 can be performed in a different order from that described herein. Also, it should be understood that although an "End" block is shown for the method, it may be continuously performed.

Conclusion

Embodiments of the present invention provide for a server rack having a plurality of e-trays that can be easily, quickly, and safely removed and reinserted. Embodiments have been disclosed in which the e-tray top is affixed to the server rack, so that it does not have to be removed and replaced when the e-tray is withdrawn for inspection, repair, replacement, and/or upgrade.

Also, by providing an automatic power-down facility, an e-tray that is withdrawn by a repair person without first powering it down does not sustain potential damage to its connector terminals or to its electronic components.

Further, by providing a cable management solution that enables e-trays to be removed and replaced without associated time-consuming removal and replacement of wires and cables, the performance of the server equipment is substantially enhanced, and it is therefore more commercially attractive. The cable management solution described herein provides a persistent interface that virtually constitutes an input/output socket at the system level, substantially facilitating the insertion and removal of electronic modules into an electronic assembly.

A number of different embodiments have been shown herein. Other embodiments will be readily apparent to those of ordinary skill in the art. The elements, materials, geometries, dimensions, and sequence of operations can all be varied to suit particular server rack and e-tray requirements.

Embodiments of the invention should not be construed as restricted to server racks, and they may find application in any type of electronic assembly structure. For example, they can be used for telecommunications equipment, power industry equipment, industrial equipment, radio and television broadcasting equipment, aerospace and military equipment, maritime equipment, automotive equipment, and personal entertainment equipment (e.g., televisions, radios, stereos, tape and compact disc players, video cassette recorders, MP3 (Motion Picture Experts Group, Audio Layer 3) players, etc.), and the like. Thus, as used herein, the terms "server rack" or "electronics rack assembly" are intended to mean any type of electronic assembly structure.

Further, the terms "electronics tray" and "e-tray" are intended to mean any type of electronic modules, such as removable electronics boards, panels, cards, or other types of electronic modules.

While cable plugs are described herein as located on the server rack, and receptacles are described as located on the e-trays, the inverse could also be implemented in other embodiments.

While a top panel has been described as being fixed in the rack, in another embodiment, the bottom panel could be fixed, and the e-tray could be inverted for example. Also, while a separate power-down mechanism for each e-tray has been disclosed, in another embodiment a single power-down mechanism could be provided for the entire server rack or a portion thereof using, for example, a light beam arrangement to detect any withdrawal and accordingly to shut down the entire server rack or portion thereof.

The terms "top", "bottom", "front", and "back" are to be understood as relative terms, and it should be understood that the scope of embodiments of the invention includes corresponding elements in structures that may be inverted or turned end-for-end relative to those shown in the figures and described herein.

The above-described choice of materials, geometry, structure, and assembly operations can all be varied by one of ordinary skill in the art to optimize the accessibility of server racks and e-trays and to minimize the time required to inspect, repair, and/or replace e-trays. The particular implementation of embodiments of the invention is very flexible in terms of the orientation, size, number, and composition of its constituent elements. Various embodiments of the invention can be implemented using any one or more of various geometrical and functional arrangements of e-tray covers, power-up/power-down mechanisms, insertion/removal mechanisms, and cable management systems to achieve the advantages of the present disclosure.

The figures are merely representational and are not drawn to scale. Certain proportions thereof may be exaggerated, while others may be minimized. FIGS. 2–16 are intended to illustrate various implementations of the invention that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present disclosure. Therefore, it is manifestly intended that embodiments of this invention be limited only by the claims and the equivalents thereof.

What is claimed is:

1. A cable management device for use with an electronics rack assembly and with an electronics tray to be removably mounted in the electronics rack assembly and having at least one multi-terminal electrical receptacle of a first gender, the cable management device comprising:
- a clamp comprising a plurality of openings, selected ones of the openings to each accommodate at least one multi-terminal cable plug, including at least one cable plug of a second gender to mate with a corresponding at least one electrical receptacle of a first gender; and
- a securing element to secure the clamp to the electronics rack assembly when the at least one electrical receptacle of the electronics tray engages with or disengages from the corresponding at least one cable plug.

2. The cable management device recited in claim 1, wherein the plurality of openings are of different physical dimensions.

3. The cable management device recited in claim 1, wherein the clamp comprises a pair of mating elements and at least one fastening element.

4. The cable management device recited in claim 1, wherein the mating elements comprise retention elements to mate with corresponding retention elements of cable plugs.

5. An electronics rack assembly comprising:
- a pair of opposing sides and a rear side;
- a cable management device affixed to the rear side and to hold at least one cable plug; and
- at least one electronics tray comprising:
  - a housing having a base and a rear panel;
  - at least one electronic component on the base and electrically coupled to a receptacle at the rear panel; and
  - mounting elements on the housing to couple to the electronics rack assembly to permit the electronics tray to be inserted substantially within the electronics rack assembly to couple the receptacle to the cable plug, and to be withdrawn from the electronics rack assembly to uncouple the receptacle from the cable plug.

6. The electronics rack assembly recited in claim 5, wherein the cable management device is to hold a plurality of cable plugs, and wherein the at least one electronics tray comprises a corresponding plurality of receptacles.

7. The electronics rack assembly recited in claim 6, wherein the cable management device comprises:
- a clamp comprising a plurality of openings, each opening being dimensioned to accommodate a cable plug; and
- a securing element to secure the clamp to the electronics rack assembly.

8. The electronics rack assembly recited in claim 7, wherein the cable plugs are of different physical dimensions.

9. The electronics rack assembly recited in claim 7, wherein the clamp comprises a pair of mating elements and at least one fastening element.

10. The electronics rack assembly recited in claim 9, wherein the mating elements comprise retention elements to mate with corresponding retention elements of cable plugs.

11. A cable management device for use with an electronics rack assembly and with an electronics tray to be removably mounted in the electronics rack assembly and having at least one electrical connector of a first gender, the cable management device comprising:
- a substrate comprising a plurality of traces, the substrate having on a first surface thereof a plurality of cable connectors, each cable connector to accommodate a cable plug, the substrate having on a second surface thereof at least one electrical connector of a second gender that is mateable with the at least one electrical connector of the first gender, each cable connector being electrically coupled to the at least one electrical connector of the second gender through the plurality of traces; and
- a securing element to secure the substrate to the electronics rack assembly when the at least one electrical connector of the electronics tray engages with or disengages from the at least one electrical connector of the substrate.

12. The cable management device recited in claim 11, wherein the plurality of cable connectors are of different physical dimensions.

13. The cable management device recited in claim 11, wherein the at least one electrical connector of the substrate comprises an edge connector.

14. An electronics rack assembly comprising:
- a pair of opposing sides and a rear side;
- a cable management device affixed to the rear side and comprising a substrate having a plurality of traces, the substrate having on a first surface thereof a plurality of cable connectors, each cable connector to accommodate a cable plug, the substrate having on a second surface thereof at least one electrical connector of a first gender, each cable connector being electrically coupled to the at least one electrical connector of the first gender through the plurality of traces; and
- at least one electronics tray comprising:
  - a housing having a base and a rear panel;
  - at least one electronic component on the base and electrically coupled to at least one electrical connector at the rear panel and being of a second gender that is mateable with the at least one electrical connector of the first gender, and
  - mounting elements on the housing to couple to the electronics rack assembly to permit the electronics tray to be inserted substantially within the electronics rack assembly to couple the at least one electrical connector on the rear panel to the at least one electrical connector on the substrate, and to be withdrawn from the electronics rack assembly to uncouple the electrical connectors from each other.

15. The electronics rack assembly recited in claim 14, wherein the cable management device comprises only one electrical connector of the first gender.

16. The electronics rack assembly recited in claim 14, wherein the plurality of cable connectors are of different physical dimensions.

* * * * *